United States Patent [19]

Masuoka et al.

[11] Patent Number: 4,903,096
[45] Date of Patent: Feb. 20, 1990

[54] SEMICONDUCTOR MEMORY DEVICE WITH BARRIER LAYER

[75] Inventors: Fujio Masuoka; Kiyofumi Ochii, both of Yokohama, Japan

[73] Assignee: Kabushiki Kaisha Toshiba, Kawasaki, Japan

[21] Appl. No.: 265,276

[22] Filed: Oct. 25, 1988

Related U.S. Application Data

[63] Continuation of Ser. No. 71,569, Jul. 10, 1987, abandoned, which is a continuation of Ser. No. 765,497, Aug. 14, 1985, abandoned.

[30] Foreign Application Priority Data

Aug. 23, 1984 [JP]  Japan ................. 59-175412
Aug. 23, 1984 [JP]  Japan ................. 59-175413

[51] Int. Cl.$^4$ ............................................ H01L 29/78
[52] U.S. Cl. ................................ 357/23.5; 357/59; 357/71; 357/67; 357/51; 357/54; 357/23.12
[58] Field of Search ................ 357/54, 59 I, 59 J, 357/51, 23.6, 23.5, 23.12, 59 G, 59 R, 59 F, 71 S, 67 S, 71

[56] References Cited

U.S. PATENT DOCUMENTS 4,278,989  7/1981  Baba et al. ...................... 357/595
4,488,166 12/1984  Lehrer ......................... 357/59 I X
4,528,582  7/1985  Cohen et al. .................. 357/59 F X
4,533,935  8/1985  Mochizuki ..................... 357/59 F X

FOREIGN PATENT DOCUMENTS 0032025  7/1981  European Pat. Off. .
0087979  9/1983  European Pat. Off. .
0097918  1/1984  European Pat. Off. .
0098737  1/1984  European Pat. Off. .

OTHER PUBLICATIONS

Murarka et al., "Refractory Silicides of Titanium and Tantaium for Low—Resitivity Gates and Interconnects," IEEE Journal of Solid—State Circuits, vol. SC—15, No. 4, Aug. 1980, pp. 474-482.
Thin Solid Films, vol. 104, No. 1/2, Jun. 1983, pp. 89-99, Lusanne, CH, Elsevier Sequoia, NL; R. J. Schutz: "Tin as a Diffusion Barrier Between CoSi2 or PtSi and Aluminum".

Primary Examiner—William Mintel
Attorney, Agent, or Firm—Finnegan, Henderson, Farabow, Garrett, and Dunner

[57] ABSTRACT

There is disclosed a memory cell in which a low resistance polycrystal silicon layer and a high resistance polycrystal silicon layer are connected to each other with a barrier metal layer provided therebetween and formed in a contact hole of an insulation film.

3 Claims, 13 Drawing Sheets

SEMICONDUCTOR MEMORY DEVICE WITH BARRIER LAYER

This is a continuation of Ser. No. 071,569, filed 7/10/87, now abandoned, which is a continuation of Ser. No. 765,497, filed 8/14/85, now abandoned.

BACKGROUND OF THE INVENTION

This invention relates to a semiconductor device comprising a high resistance layer made of polycrystal silicon.

An E/R (enhancement/resistor) type static memory cell is known as a semiconductor static memory cell. The E/R type static memory cell comprises a high resistance element made of polycrystal silicon.

Figure 1:
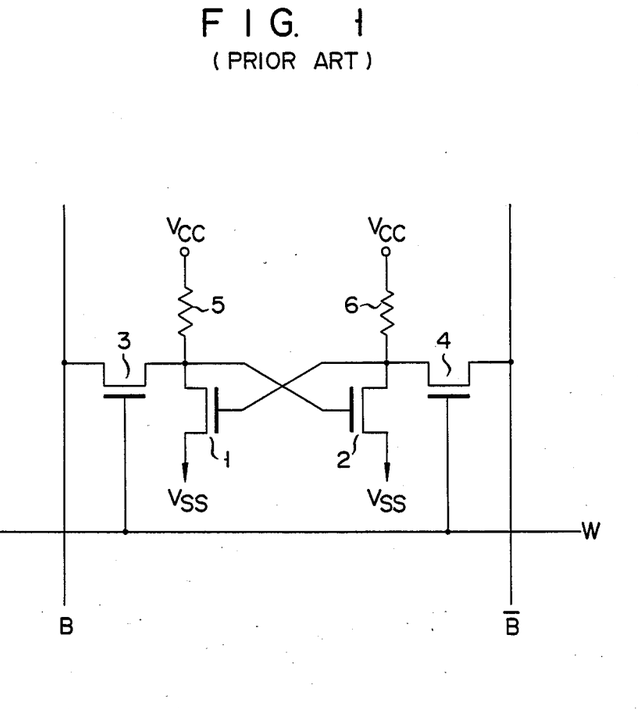
FIG. 1 shows a circuit diagram of an E/R type static memory cell.
Figure 2:
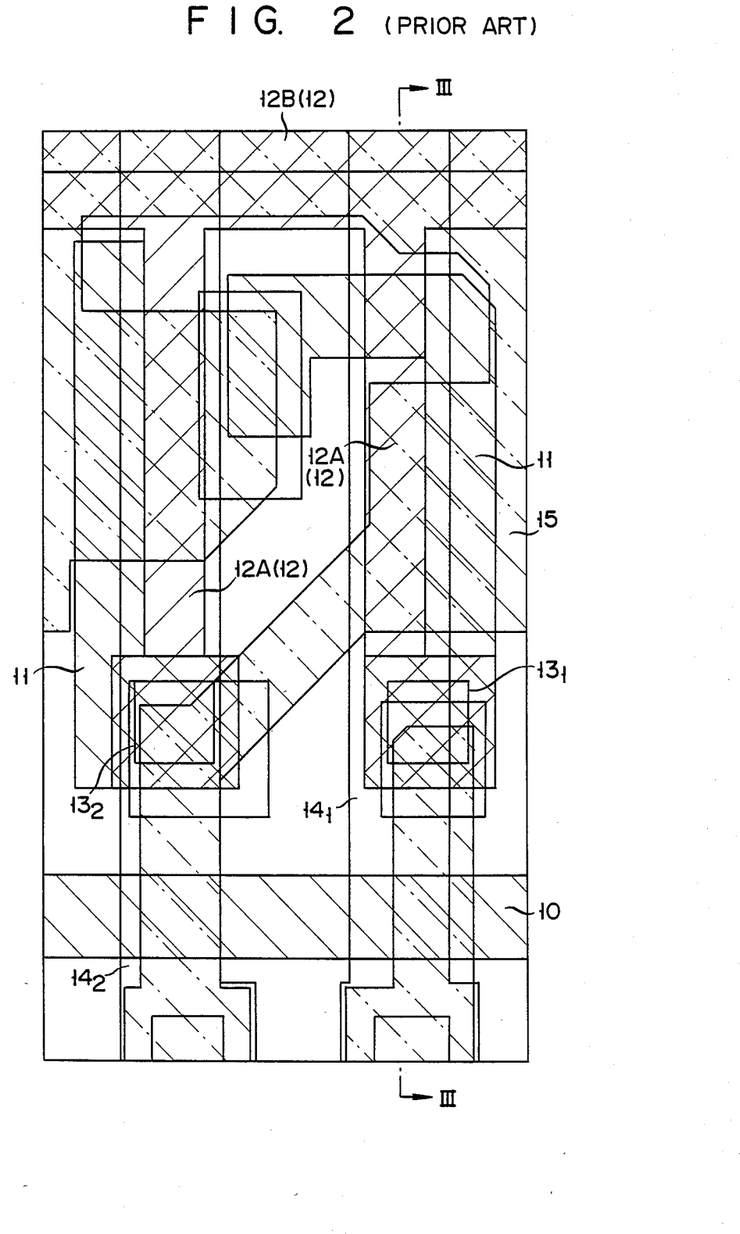
FIG. 2 shows a pattern of a conventional E/R static memory cell of the type shown in FIG. 1.
Figure 3:
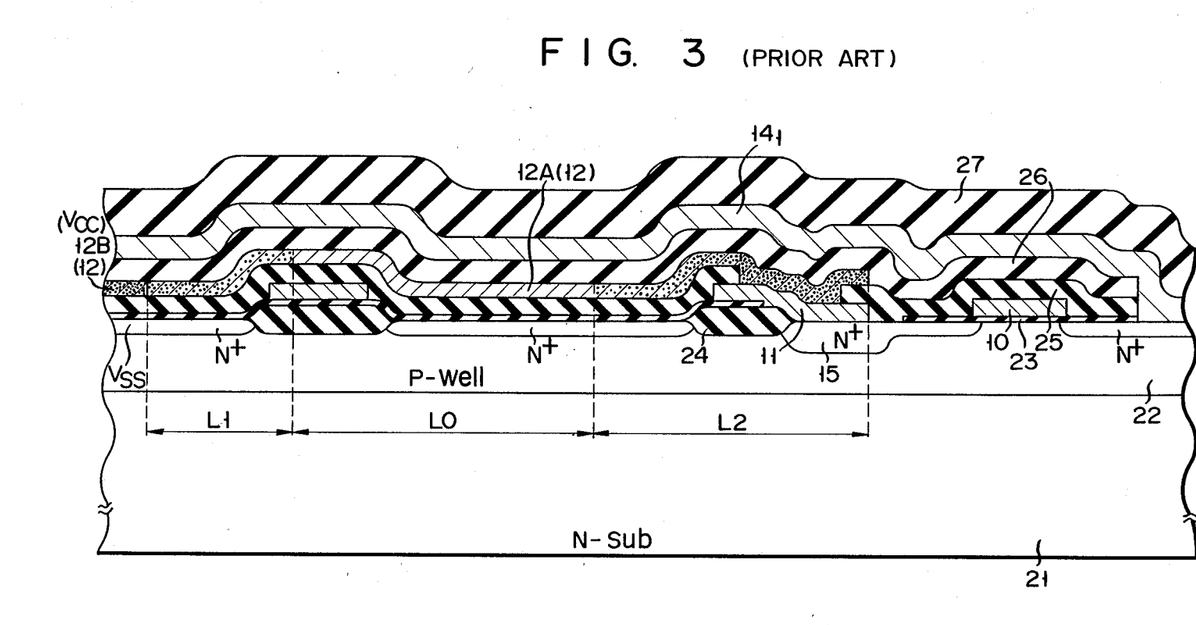
FIG. 3 shows a cross sectional view of the static memory cell shown in FIG. 2, as taken along lines III—III, and viewed in the direction indicated by arrows.

As shown in FIG. 1, the E/R type static memory cell comprises a flip-flop, an access gate and a pair of load resistors of a high resistance. The flip-flop comprises MOS (metal oxide semiconductor) transistors 1 and 2 of an enhancement type. The access gate comprises MOS transistors 3 and 4 of an enhancement type. The load resistors comprise resistors 5 and 6. Vcc and Vss denote high and low power source potentials, respectively. B and B̄ indicate bit lines. W denotes a word line. In FIG. 2, reference numeral 10 denotes a word line layer. First polycrystal silicon layer 11 is highly doped with an impurity and has a low resistance. Second polycrystal silicon layer 12 comprises high resistance region 12A, and low resistance region 12B, highly doped with an impurity. Silicon layer 11 and high resistance region 12A contact each other within contact hole $13_1$. Bit line layers $14_1$ and $14_2$, made of aluminium, cross over contact holes $13_1$ and $13_2$, respectively. Low resistance region 12B is used as a Vcc line. Reference numeral 15 denotes N Conductivity type, impurity diffused semiconductor regions. In FIG. 3, reference numeral 21 denotes N conductivity type substrate. P conductivity type well layer 22, made of single crystal silicon, is formed on substrate 21. N+ conductivity type, impurity diffused regions 15 are formed in well layer 22. Reference numeral 23 denotes gate insulation film made of $SiO_2$. Reference numeral 24 denotes field insulation film made of $SiO_2$. Silicon layer 11 is formed on semiconductor region 15. Reference numeral 25 denotes field insulation film made of $SiO_2$, having contact hole $13_1$ formed therein. Insulation film 26, made of $SiO_2$, is formed on insulation film 25 and silicon layer 12. Bit line layer $14_1$ contacts N conductivity type, impurity diffused region 15, and extends onto insulation film 25. Passivation film 27 is formed on bit line layer $14_1$.

In manufacturing the device shown in FIGS. 2 and 3, insulation film 26, made of $SiO_2$, bit line layer $14_1$ and passivation film 27 are formed after insulation film 25 is formed. Forming insulation film 26, bit line layer $14_1$ and passivation film 27 comprises a thermal treatment step. The thermal treatment diffuses impurities, doped in low resistance region 12B, into high resistance region 12A by the portion whose length is shown by L1. The thermal treatment also diffuses impurities, doped in low resistance layer 11, into high resistance region 12A by the portion whose length is shown by L2. Therefore, the effective region of high resistance region 12A is shortened by the portions whose lengths are shown by L1 and L2. The length of the effective region is shown by L0. The effective region of silicon layer 12 determines the power consumption in the memory cell. The shorter the effective region is, the larger the power consumption is. In order to reduce layer 12 longer. This, however, makes the memory cell size large and the packing density low.

SUMMARY OF THE INVENTION

This invention has been achieved in consideration of the above-mentioned circumstances, the object being to provide a semiconductor device in which the length of the effective high resistance region of the polycrystal silicon layer, used as a resistor, is increased without increasing the size of the memory cell.

DETAILED DESCRIPTION OF THE PREFERRED EMBODIMENT

Figure 4:
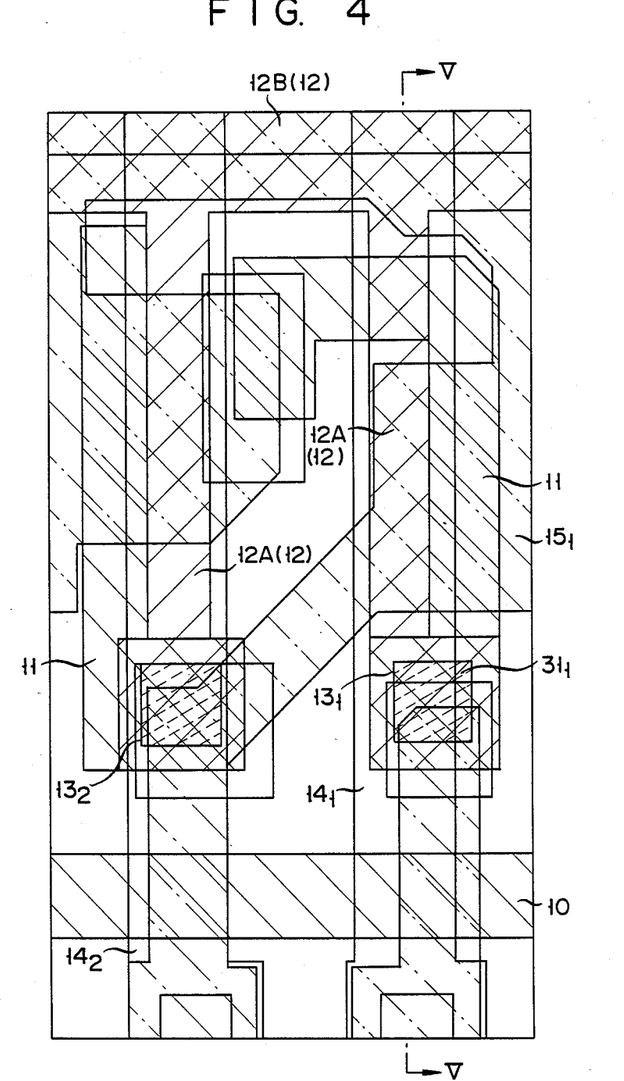
FIG. 4 shows a pattern of an E/R static memory cell of an embodiment according to the invention.
Figure 5:
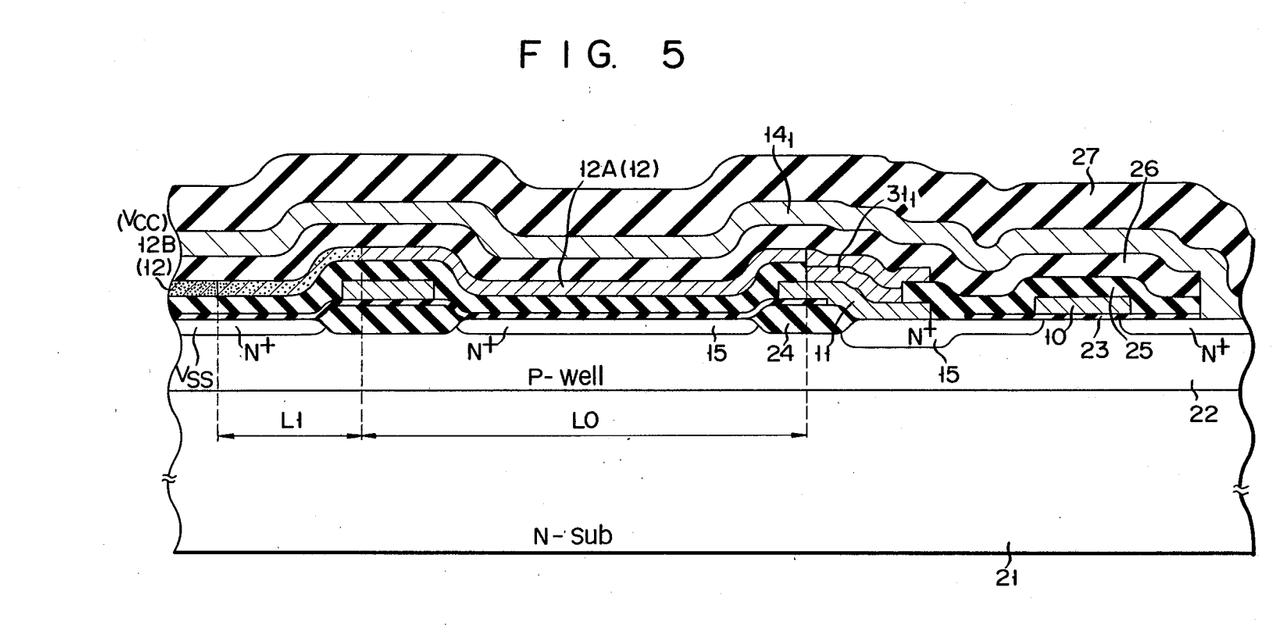
FIG. 5 shows a cross sectional view of the static memory cell in FIG. 4, as taken along lines V—V, and viewed in the direction indicated by arrows.

An embodiment according to the invention will now be described with reference to FIGS. 4 and 5. The invention of this and all subsequently described embodiments, applies to an E/R (enhancement/resistor) type static memory cell, a circuit diagram of which is shown in FIG. 1. For brevity of illustration, the same reference numerals are employed for the same components throughout the prior art depicted in FIGS. 2 and 3, as well as for all the embodiments of the invention. In FIGS. 4 and 5, reference numeral 10 is a word line layer. First polycrystal silicon layer 11 is highly doped with an impurity, and has a low resistance. Second polycrystal silicon layer 12 comprises high resistance region 12A and low resistance region 12B. Low resistance region 12B is highly doped with an impurity, and constitutes a Vcc line. Layer $31_1$, made of metal (for example, tungsten) having a high melting point, is formed in contact hole $13_1$. A metal silicide layer having a high melting point may be employed in place of metal layer $31_1$. Such a metal or metal silicide ohmically contacts the single crystal silicon or polycrystal silicon. Silicon layer 11 is connected to high resistance region 12A of silicon layer 12, with metal layer $31_1$ provided therebetween. Layers $14_1$ and $14_2$, constituting bit lines made of, for example, aluminium, cross over contact holes $13_1$ and $13_2$, respectively. Reference numerals 15 denote N+ conductivity type, impurity diffused semiconductor regions. In FIG. 5, reference numeral 21 an N conductivity type substrate made of single crystal silicon. A P conductivity type well layer 22, made of single crystal silicon, is formed in substrate 21. N+ conductivity type, impurity diffused regions 15, made of single crystal silicon, are formed in well layer 22. Reference numeral 23 denotes a gate insulation film made of $SiO_2$. Reference numeral 24 denotes a field insulation film made of $SiO_2$. Silicon layer 11 is formed on semiconductor region 15. Reference numeral 25 denotes field insulation film made of $SiO_2$ and having, therein, contact hole $13_1$. Metal layer $31_1$ is formed in contact hole $13_1$. Metal layer $31_1$ can be provided by a known method by which metal is deposited only on a portion of an exposed surface of silicon layer 12. One example of such a method is disclosed in T. Moriya, S. Shima, Y. Hazuki, M. Chiba and M. Kashiwagi, "A PLANAR METALLIZATION PROCESS, ITS INTERCONNECTION", IEDM Dig. Tech. Papers, (Dec. 1983), pp. 550 to 553. High resistance region 12A, of silicon layer 12, is connected to low resistance silicon layer 11 with metal layer $31_1$ provided therebetween. That is, silicon layer 11 is formed on one surface of metal layer $31_1$, provided in contact hole $13_1$, and high resistance region 12A is formed on the other surface of metal layer $31_1$. Insulation film 26, made of $SiO_2$, is formed on insulation film 25 and silicon layer 12. Bit line layer $14_1$ contacts N conductivity type, impurity diffused region 15, and extends onto insulation film 25. Passivation film 27 is formed on bit line layer $14_1$.

In manufacturing the cell shown in FIGS. 4 and 5, insulation film 26, bit line layers $14_1$, $14_2$ and passivation film 27 are formed after silicon layer 12 is formed. Forming insulation film 26, bit line layers $14_1$, $14_2$ and passivation film 27 comprises a thermal treatment step. If no barrier were provided between silicon layer 11 and high resistance region 12A of silicon layer 12, the thermal treatment would diffuse an impurity, doped in silicon layer 11, into high resistance region 12A of silicon layer 12. In the cell of this embodiment, metal layer $31_1$ is provided between silicon layer 11 and high resistance region 12A. Therefore, an impurity doped in silicon layer 11 is prevented from diffusing into high resistance region 12A. Therefore, an ineffective region, whose length is shown by L2 in FIGS. 2 and 3, is not produced. This increases the effective region, whose length is shown by L0, by the length L2 of the ineffective region when compared with the prior memory cell shown in FIGS. 2 and 3. As can clearly be understood from the above, in the memory cell of the embodiment, the length of the effective region of high resistance region 12A is increased without increasing the memory cell size.

Another embodiment according to the invention will now be described with reference to FIG. 6. In this embodiment, low resistance silicon layer 11, provided in the embodiment in FIGS. 4 and 5, is not provided, and metal layer $31_1$ contacts N+ semiconductor region or single crystal region 15 of a low resistance. If no barrier was provided between low resistance semiconductor region 15 and high resistance region 12A, of silicon layer 12, the thermal treatment described in the first recited embodiment would diffuse an impurity, doped in semiconductor region 15, into high resistance region 12A of silicon layer 12. In the device of this embodiment, metal layer $31_1$ is provided between semiconductor region 15 and high resistance region 12A, preventing an impurity doped in semiconductor region 15 from diffusing into high resistance region 12A. Therefore, the ineffective region, whose length is shown by L2 in FIGS. 2 and 3, does not appear. This increases the effective region, whose length is shown by L0, by the length L2 of the ineffective region which would appear if metal layer $31_1$ were not provided between semiconductor region 15 and high resistance region 12A. Therefore, in the memory cell of the embodiment, the length of the effective region L0 of high resistance region 12A is increased without increasing the memory cell size. Other elements are substantially the same as those in the first mentioned embodiment, and the descriptions thereof are omitted.

Figure 7:
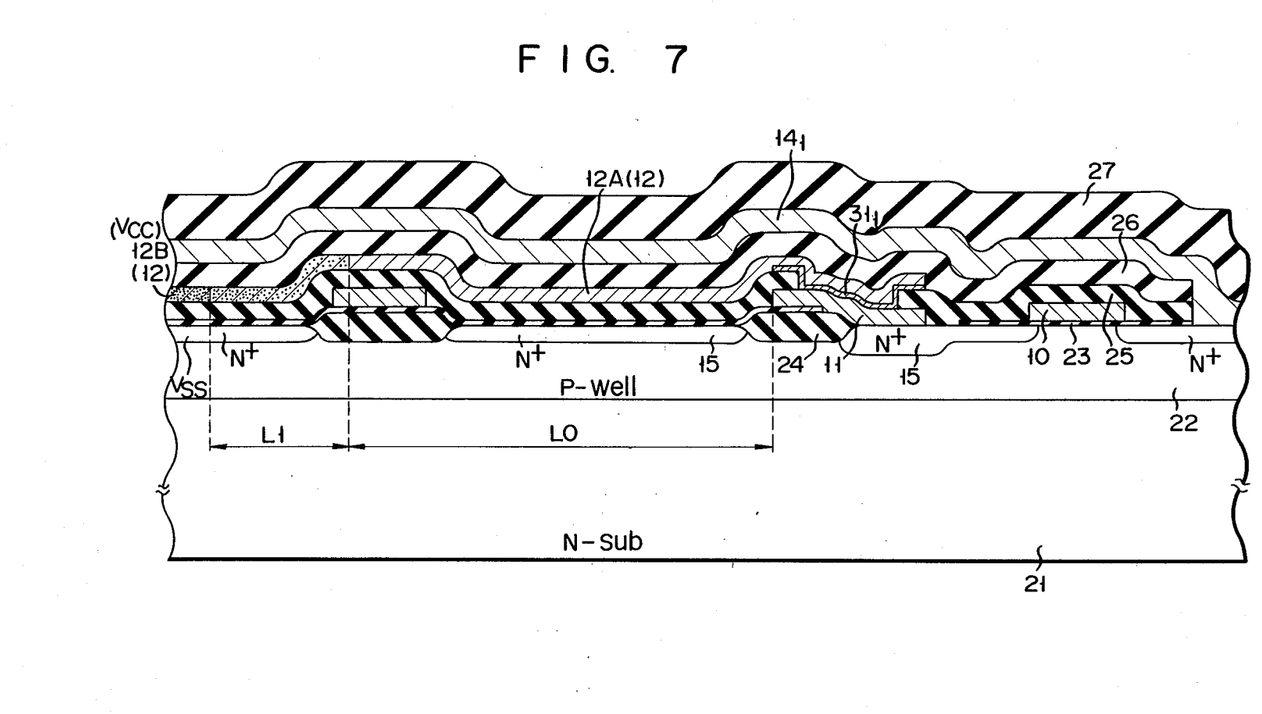
FIG. 7 shows a cross sectional view of an E/R static memory cell of a further embodiment according to the invention.

Description will now be made of a further embodiment, according to the invention, with reference to FIG. 7. In this embodiment, metal layer $31_1$ extends from the inside of contact hole $31_1$ onto the upper surface of the insulation film 25. High resistance region 12 is connected to low resistance silicon layer 11 with metal layer $31_1$ provided therebetween. Therefore, as in the embodiments described above, metal layer $31_1$ acts as a barrier to the diffusion of an impurity, preventing an impurity doped in silicon layer 11 from diffusing into high resistance region 12A, so that an ineffective region, whose length is shown by L2 in FIGS. 2 and 3, will not be produced. This increases the effective region, whose length is shown by L0, by the length L2 of the ineffective region which would appear if metal layer $31_1$ was not provided between silicon layer 11 and high resistance region 12A. Therefore, in the memory cell of this embodiment, the length L0 of the effective region of high resistance layer 12 is greatly increased without increasing the memory cell size. Other elements are substantially the same as those in the embodiments of FIGS. 4 and 5, and, therefore, the descriptions thereof are omitted.

Figure 8:
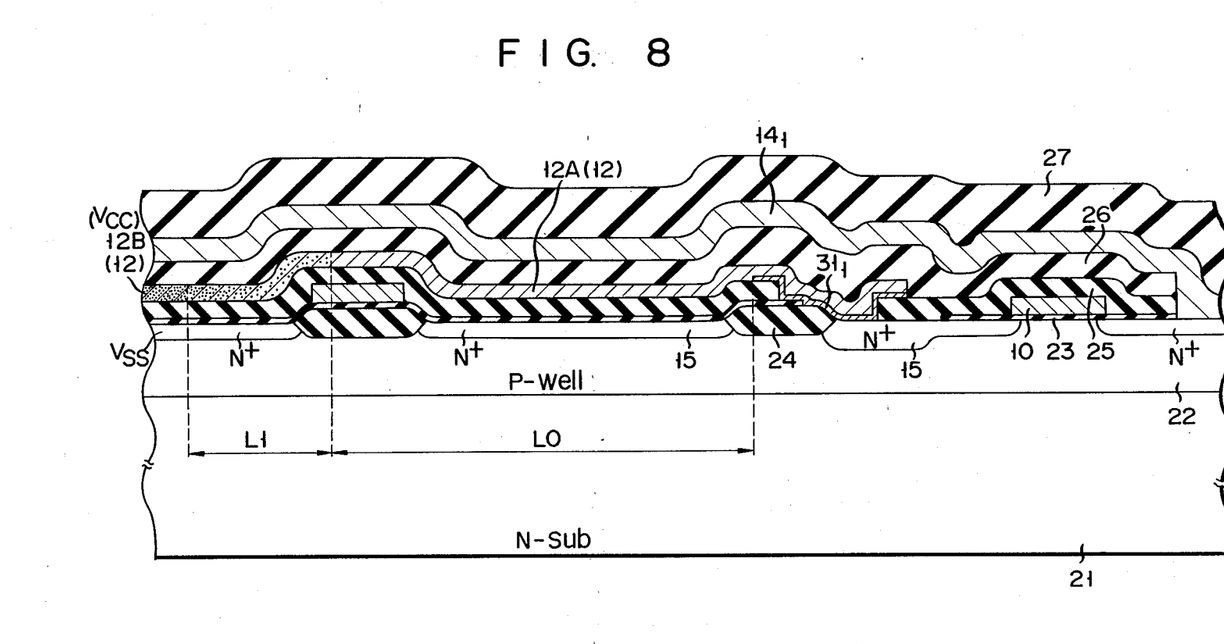
FIG. 8 shows a cross sectional view of an E/R static memory cell of still another embodiment according to the invention.

Description will now be made of a further embodiment, according to the invention, with reference to FIG. 8. In this embodiment, metal layer $31_1$ extends from the inside of contact hole $31_1$ onto the upper surface of the insulation film 25. High resistance region 12 is connected to low resistance semiconductor region 15 with metal layer $31_1$ provided therebetween. Therefore, as in the embodiment of FIG. 6, metal layer $31_1$ acts as a barrier to diffusion of an impurity, preventing an impurity doped in semiconductor region 15 from diffusing into high resistance region 12A. Therefore, an ineffective region, whose length is shown by L2 in FIGS. 2 and 3, is not produced. This increases the effective region, whose length is shown by L0, by the length L2 of the ineffective region which would appear if metal layer $31_1$ was not provided between semiconductor region 15 and high resistance region 12A. Therefore, in the memory cell of this embodiment, the length L0 of the effective region of high resistance region 12A is increased without increasing the memory cell size.

Figure 6:
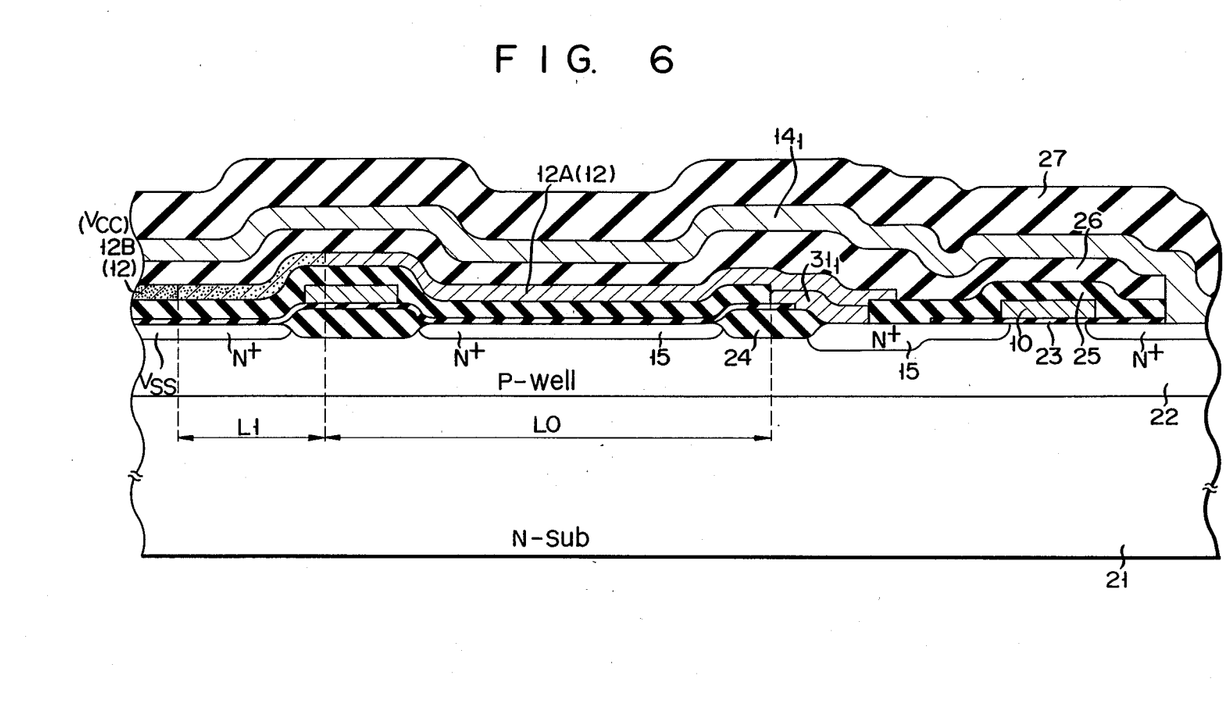
FIG. 6 shows a cross sectional view of an E/R static memory cell of another embodiment according to the invention.

Other elements are substantially the same as those in the embodiments of FIG. 6, and, therefore, the descriptions thereof are omitted.

Figure 9:
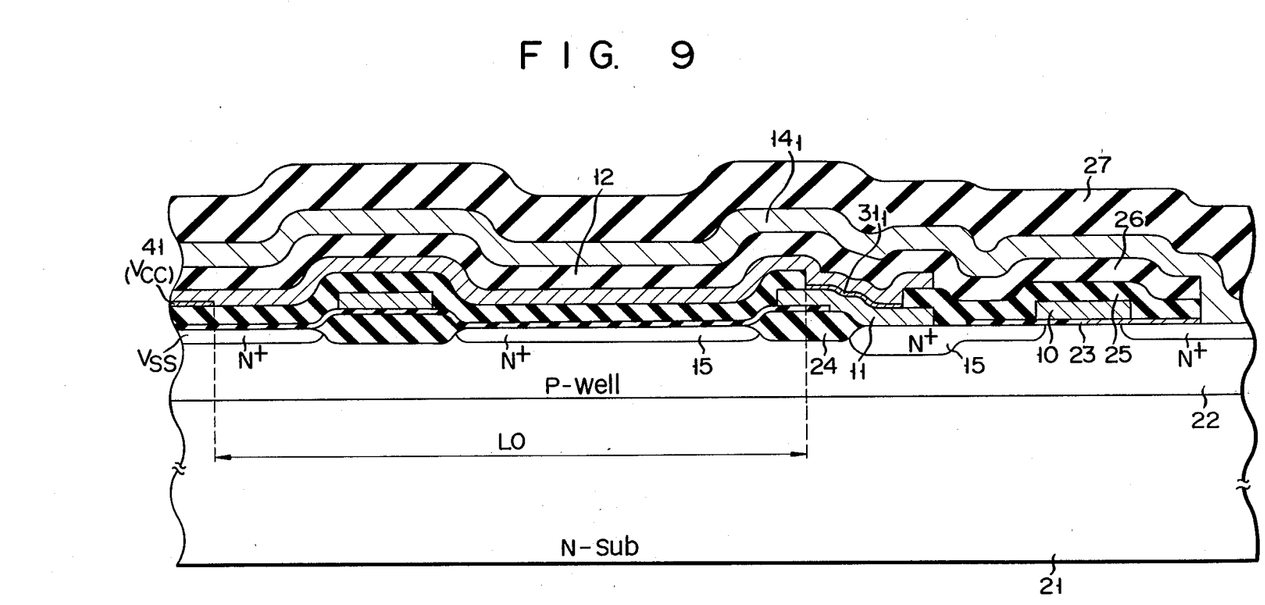
FIG. 9 shows a cross sectional view of an E/R static memory cell of still a further embodiment according to the invention.

A further embodiment will now be described with reference to FIG. 9. In this embodiment, low resistance region 12A, used as a Vcc line and provided in the embodiment in FIGS. 4 and 5, is not provided. Instead, layer 41, made of a metal having a high melting point, is provided under the region of high resistance silicon layer 12 where a Vcc line is usually provided. (Layer 41 may be provided before forming silicon layer 12, and metal silicide having a high melting point may be employed in place of the metal of layer 41.) Therefore, an ineffective region whose length is shown by L1 in FIGS. 2 and 3 will not appear. This increases the effective region, whose length is shown by L0, by the length L1 of the ineffective region which would appear if metal layer $31_1$ was not provided between silicon layer 11 and high resistance layer 12. Therefore, in the memory cell of this embodiment, the length L0 of the effective region of high resistance layer 12 is increased without increasing the memory cell size. Other elements are substantially the same as in the embodiment of FIGS. 4 and 5, and, therefore, the descriptions thereof are omitted.

Figure 10:
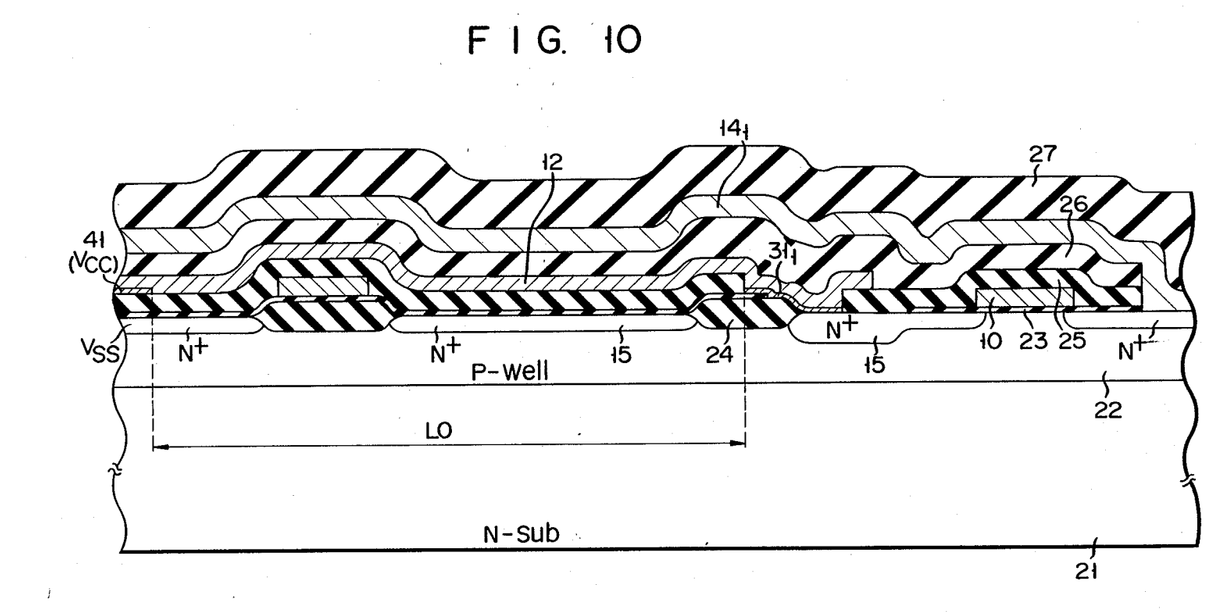
FIG. 10 shows a cross sectional view of an E/R static memory cell of another embodiment according to the invention.

A further embodiment will now be described with reference to FIG. 10. In this embodiment, low resistance region 12A, used as a Vcc line and provided in the embodiment in FIG. 6, is not provided. Instead, layer 41, made of a metal having a high melting point, is provided under the region of high resistance silicon layer 12 where a Vcc line is usually provided. (Layer 41 may be made of a metal silicide having a high melting point, in place of the metal having a high melting point.) Therefore, an ineffective region, whose length is shown by L1 in FIGS. 2 and 3, will not appear. This increases the effective region, whose length is shown by L0, by the length L1 of the ineffective region which would appear if metal layer $31_1$ was not provided between silicon layer 11 and high resistance layer 12. Therefore, in the memory cell of this embodiment, the length L0 of the effective region of high resistance layer 12 is increased without increasing the memory cell size. Other elements are substantially the same as in the embodiment of FIG. 6, and, therefore, the descriptions thereof are omitted.

Figure 11:
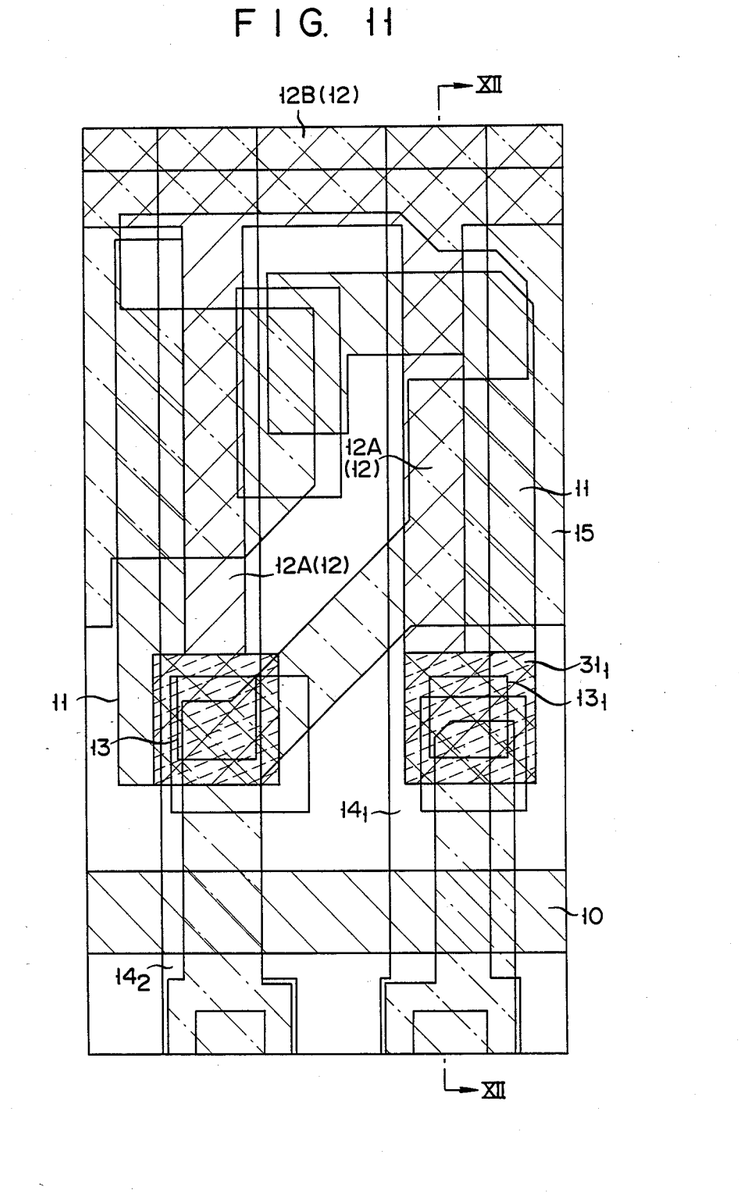
FIG. 11 shows a pattern of an E/R static memory cell of a further embodiment according to the invention.
Figure 12:
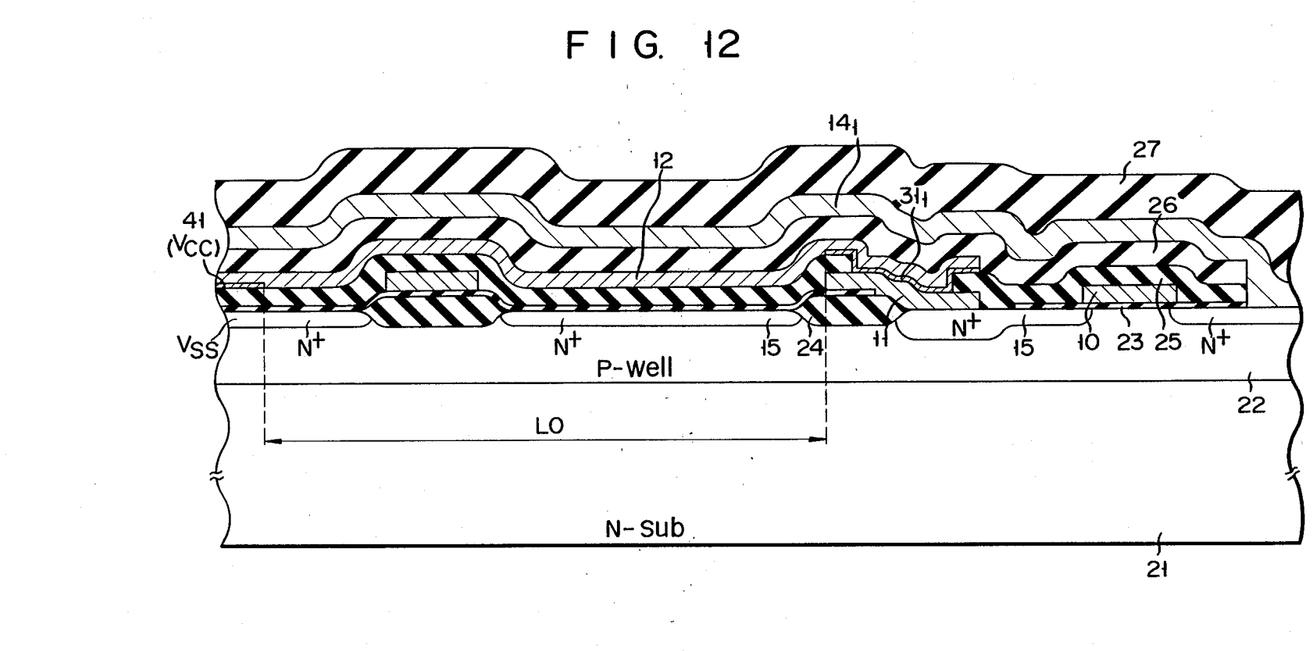
FIG. 12 shows a cross sectional view of the static memory cell in FIG. 11, as taken along lines XII—XII, and viewed in the direction indicated by arrows.

Description will now be made of a further embodiment, according to the invention, with reference to FIGS. 11 and 12. In this embodiment, metal layer $31_1$ extends from the inside of contact hole $31_1$ onto the upper surface of the insulation film 25. High resistance region 12 is connected to low resistance silicon layer 11 with metal layer $31_1$ provided therebetween. Therefore, as in the preceding embodiments, metal layer $31_1$ acts as a barrier to the diffusion of an impurity, preventing an impurity doped in silicon layer 11 from diffusing into high resistance region 12A. Therefore, an ineffective region, whose length is shown by L2 in FIGS. 2 and 3, will not be produced. This increases the effective region, whose length is shown by L0, by the length L2 of the ineffective region which would appear if metal layer $31_1$ was not provided between silicon layer 11 and high resistance region 12A. Furthermore, in this embodiment, low resistance region 12A, used as a Vcc line and provided in the embodiments in FIGS. 4 and 5, is not provided. Instead, layer 41, made of a metal having a high melting point is provided under the region of high resistance silicon layer 12 where a Vcc line is usually provided. (Layer 41 may be made of a metal silicide having a high melting point, in place of the metal having a high melting point.) Therefore, an ineffective region, whose length is shown by L1 in FIGS. 2 and 3, will not appear. This increases the effective region, whose length is shown by L0, by the length L1 of the ineffective region which would appear if metal layer $31_1$ was not provided between silicon layer 11 and high resistance layer 12. Consequently, in the memory cell of this embodiment, the length L0 of the effective region of high resistance layer 12 is greatly increased without increasing the memory cell size. Other elements are substantially the same as those in the embodiment of FIGS. 4 and 5, and, therefore, the descriptions thereof are omitted.

Figure 13:
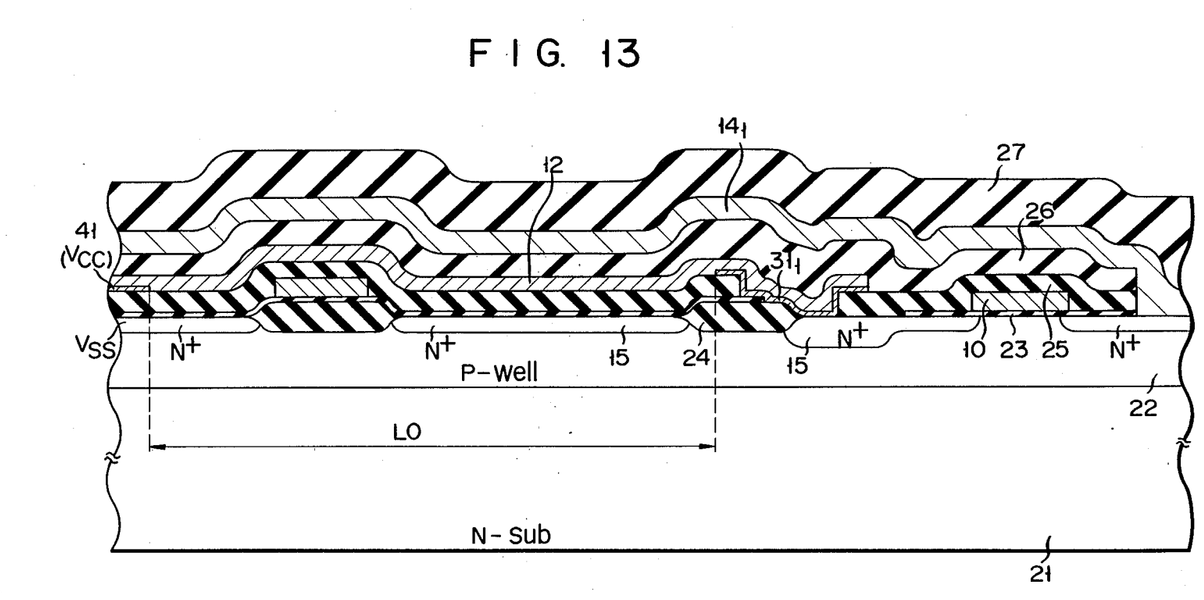
FIG. 13 shows a cross sectional view of an E/R static memory cell of still another embodiment according to the invention.

Description will now be made of a further embodiment, according to the invention, with reference to FIG. 13. In this embodiment, metal layer $31_1$ extends from the inside of contact hole $13_1$ onto the upper surface of the insulation film 25. High resistance region 12 is connected to low resistance semiconductor region 15 with metal layer $31_1$ provided therebetween. Therefore, as in the embodiment of FIG. 6, metal layer $31_1$ acts as a barrier to the diffusion of an impurity, preventing an impurity doped in semiconductor region 15 from diffusing into high resistance region 12A. Therefore, an ineffective region, whose length is shown by L2 in FIGS. 2 and 3, will not be produced. This increases the effective region, whose length is shown by L0, by the length L2 of the ineffective region which would appear if metal layer $31_1$ was not provided between semiconductor region 15 and high resistance region 12A. Furthermore, in this embodiment, low resistance region 12A, used as a Vcc line and provided in the embodiment of FIG. 6, is not provided. Instead, layer 41, made of a metal having a high melting point, is provided under the region of high resistance silicon layer 12 where a Vcc line is usually provided. (Layer 41 may be made of a metal silicide having a high melting point, in place of the metal having a high melting point.) Therefore, an ineffective region, whose length is shown by L1 in FIGS. 2 and 3, will not appear. This increases the effective region, whose length is shown by L0, by the length L1 of the ineffective region which would appear if metal layer $31_1$ was not provided between semiconductor region 15 and high resistance layer 12. Consequently, in the memory cell of this embodiment, the length L0 of the effective region of high resistance layer 12 is greatly increased without increasing the memory cell size. Other elements are substantially the same as those in the embodiment of FIG. 6, and, therefore, the descriptions thereof are omitted.

As can be clearly understood from the preceding, there can be provided, in the present invention, a semiconductor device in which the effective region of the high resistance polycrystal silicon layer, forming a resistor, can be increased without increasing the cell size.

What is claimed is:

1. A static memory cell of a semiconductor device comprising:
   a first layer of polycrystal silicon containing semiconductor impurities of a selected conductivity type and having a resistance;
   a second layer of a predetermined length of polycrystal silicon overlapping said first layer and having a resistance higher than that of said first layer, said second layer having a first portion and a second portion, said second portion of said second layer forming a load resistor of the static memory cell;

an insulation film provided between said first layer and said second layer and having a contact hole formed therein and an upper surface; and a barrier layer for preventing the semiconductor impurities contained in the silicon of said first layer from entering said second layer, the barrier layer comprising a silicide layer of a refractory metal contacting said first portion of said second layer of polycrystal silicon, the barrier layer extending in a current path of said first portion of said second layer of polycrystal silicon, through which an electric current flows, to reduce the resistance in said current path of said first portion of said second layer of polycrystal silicon, said barrier layer having a first portion formed in said contact hole and a second portion extending on the upper surface of a portion of said insulation film and between said insulation film and said second polycrystal silicon layer, the area of said second portion of said barrier layer establishing the resistance of said load resistor by determining the size of the area of said second portion of said second layer of polycrystal silicon wherein said semiconductor impurities contained in said silicon of said first layer may enter said second layer, the first portion of said barrier layer formed in said contact hole being sandwiched by said first and second silicon layers and connecting the first and second silicon layers.

2. A static memory cell of a semiconductor device according to claim 1, wherein said first portion of said second polycrystal silicon layer is substantially undoped with semiconductor impurities, and said device further comprises a wiring layer formed on a predetermined region of said second polycrystal silicon layer and has a resistance lower than that of said second polycrystal silicon layer.

3. A static memory cell of a semiconductor device according to claim 2, wherein said wiring layer comprises a silicide layer of a refractory metal.

* * * * *